(12) United States Patent
Monson et al.

(10) Patent No.: US 7,135,704 B2
(45) Date of Patent: Nov. 14, 2006

(54) VCSEL SETTLING FIXTURE

(75) Inventors: Robert J. Monson, St. Paul, MN (US);
Trevor J. McCollough, Minneapolis, MN (US); Jianhua (Jack) Yan, Prior Lake, MN (US)

(73) Assignee: Lockhead Martin Corporation, Bethesda, MD (US)

( * ) Notice: Subject to any disclaimer, the term of this patent is extended or adjusted under 35 U.S.C. 154(b) by 335 days.

(21) Appl. No.: 10/641,398

(22) Filed: Aug. 14, 2003

(65) Prior Publication Data

US 2005/0036529 A1 Feb. 17, 2005

(51) Int. Cl.
*H01L 23/58* (2006.01)
*H01L 23/34* (2006.01)
*H01L 23/12* (2006.01)

(52) U.S. Cl. .................. 257/48; 257/727; 257/731; 257/E23.011

(58) Field of Classification Search .................. 257/48, 257/727, 731, E23.011
See application file for complete search history.

(56) References Cited

U.S. PATENT DOCUMENTS

| | | | |
|---|---|---|---|
| 5,617,036 A * | 4/1997 | Roff | ............................ 324/760 |
| 5,891,746 A | 4/1999 | Kuchta | |
| 5,905,382 A | 5/1999 | Wood et al. | |
| 6,301,121 B1 * | 10/2001 | Lin | ............................ 361/783 |
| 6,322,257 B1 * | 11/2001 | Kryzak | ........................ 385/88 |
| 6,340,895 B1 | 1/2002 | Uher et al. | |
| 6,400,172 B1 * | 6/2002 | Akram et al. | ................ 324/765 |
| 6,562,636 B1 | 5/2003 | Richmond et al. | |
| 6,623,997 B1 * | 9/2003 | Chang et al. | .................. 438/18 |
| 6,709,877 B1 * | 3/2004 | Tsui et al. | ..................... 438/14 |
| 6,922,496 B1 * | 7/2005 | Morris | ........................ 385/14 |
| 2002/0004320 A1 * | 1/2002 | Pedersen et al. | ............... 439/66 |
| 2002/0076841 A1 | 6/2002 | Chang et al. | |
| 2002/0196431 A1 | 12/2002 | DeFelice et al. | |
| 2003/0017629 A1 | 1/2003 | Tsui et al. | |
| 2004/0135595 A1 * | 7/2004 | Chen et al. | .................. 324/767 |

* cited by examiner

*Primary Examiner*—Shouxiang Hu
(74) *Attorney, Agent, or Firm*—Brooks & Cameron, PLLC

(57) ABSTRACT

A VCSEL settling fixture provides for a plurality of VCSEL chip packages to be selectively tested within a burn-in or environmental chamber having a remote pendant controller. The settling fixture includes a mounting frame including a plurality of recesses and throughbores for positioning and aligning the VCSEL's on the mounting frame. The mounting frame further includes a plurality of terminal blocks in proximity to the recesses for interconnecting the mounting frame with the controller. An activation system including a plurality of electrical contacts electrically connects the individual VCSEL chip packages with the terminal blocks so that the controller can selectively trigger a laser output from the VCSEL chip package.

12 Claims, 7 Drawing Sheets

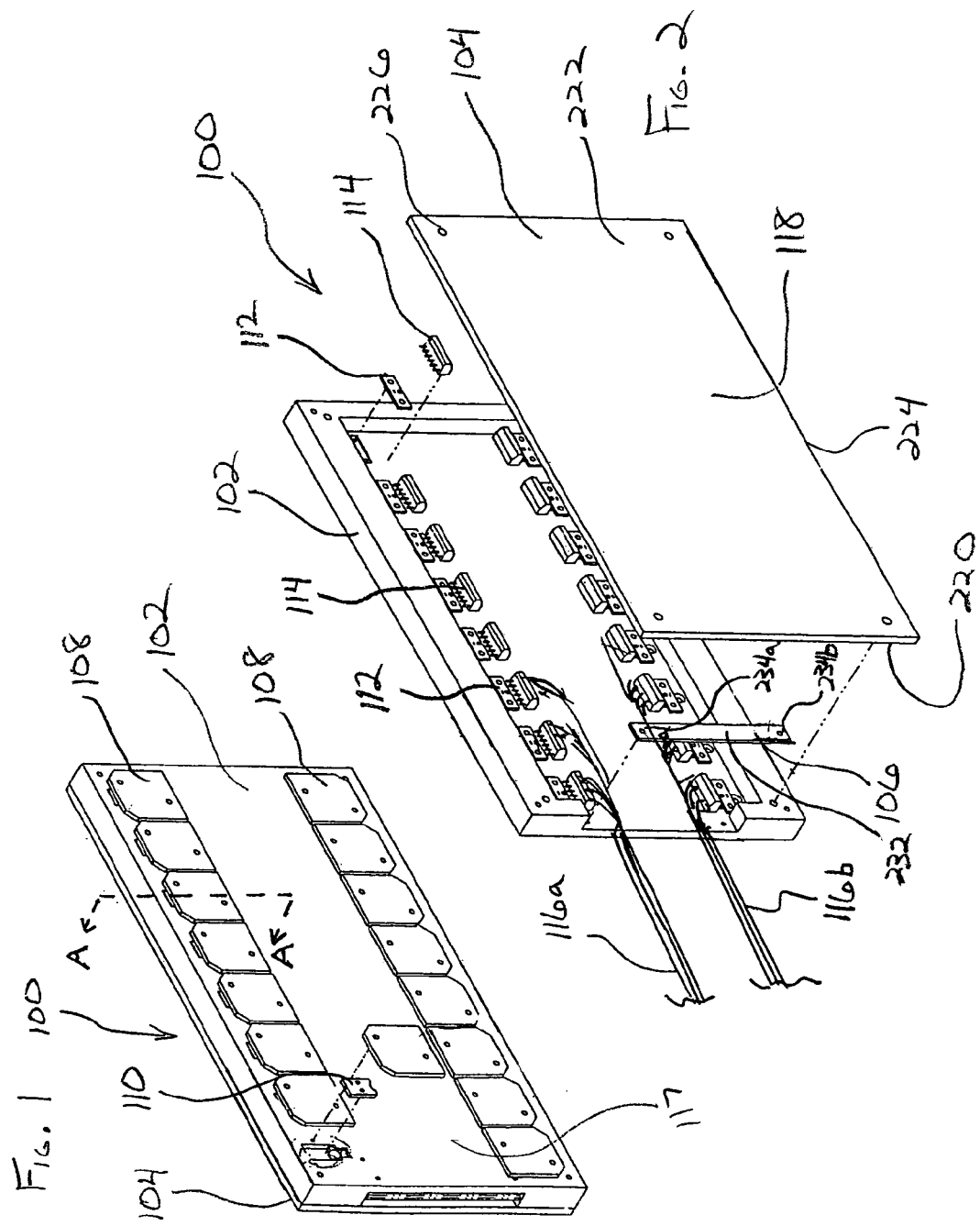

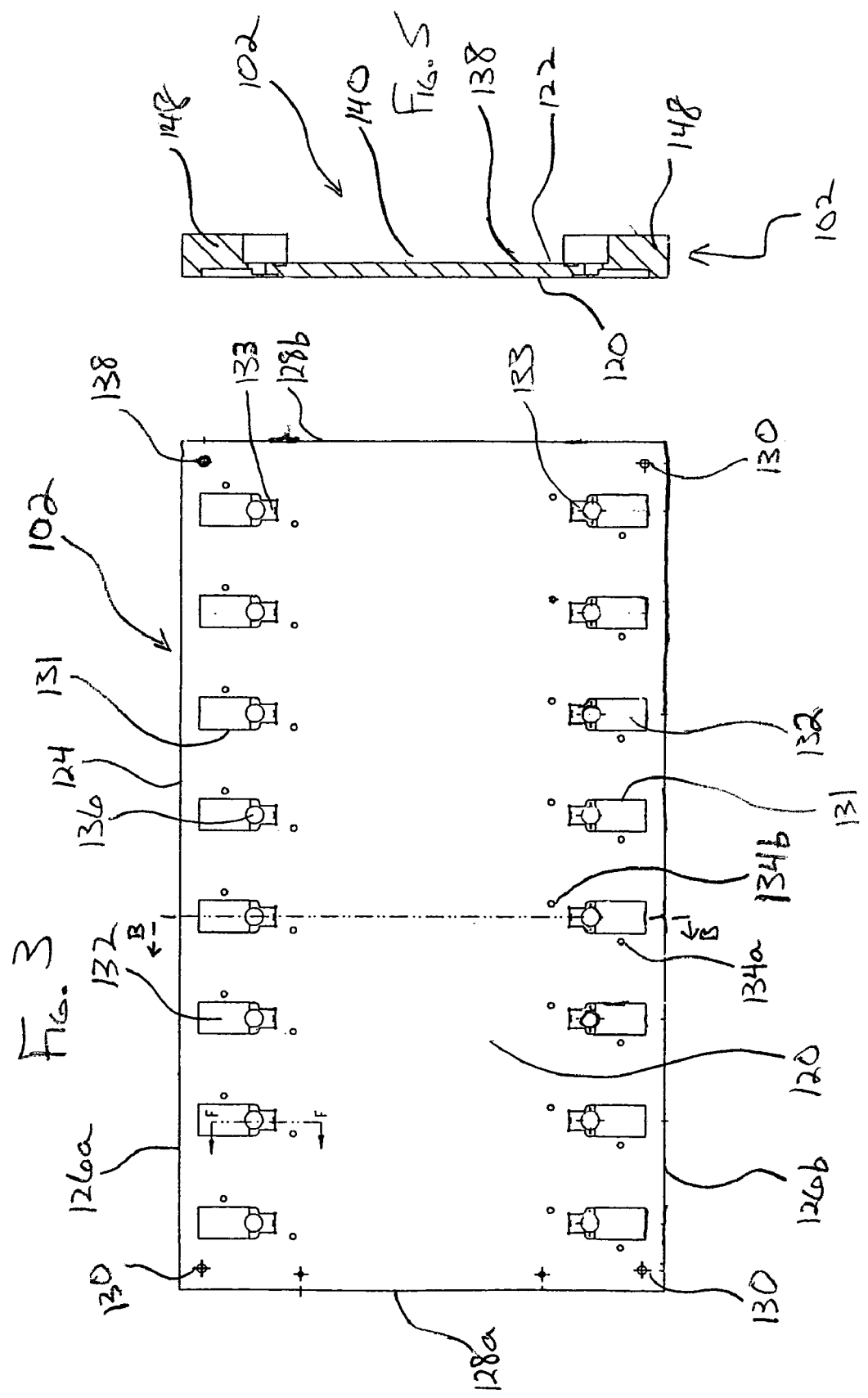

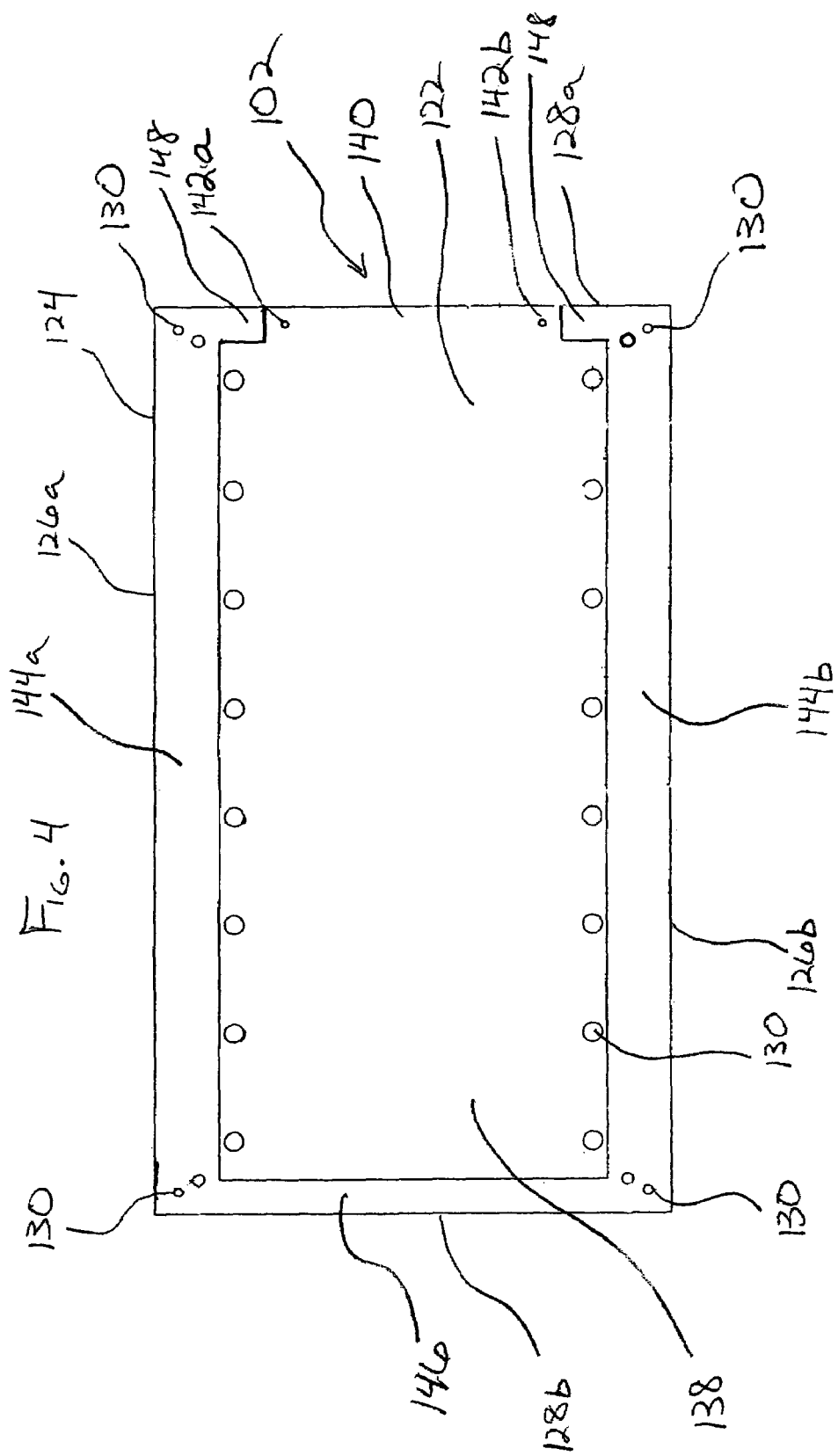

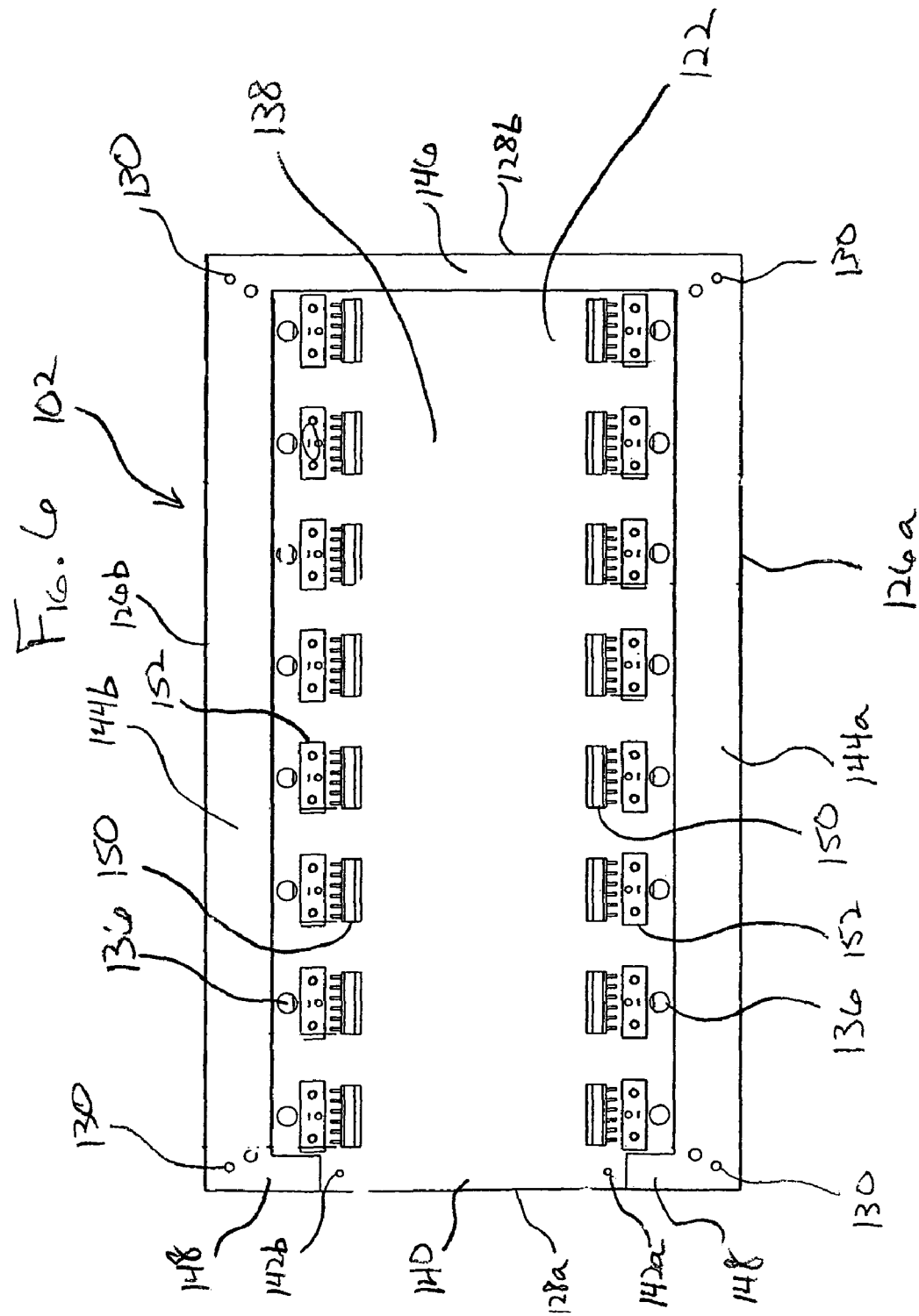

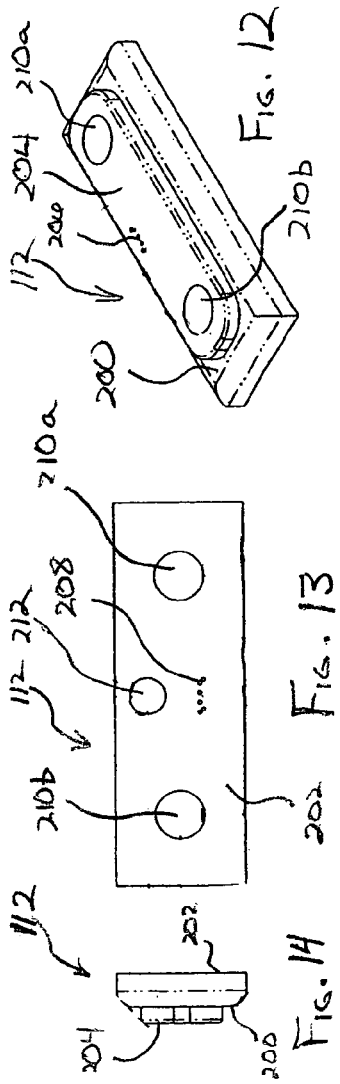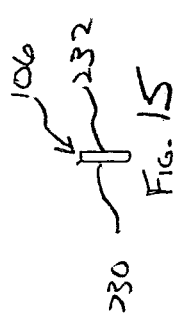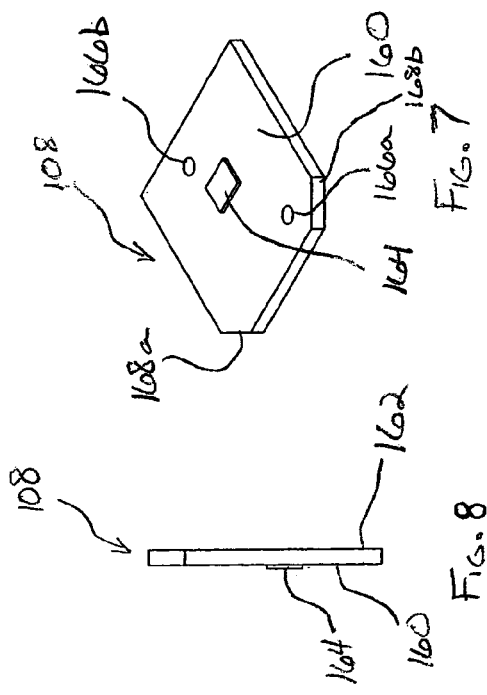

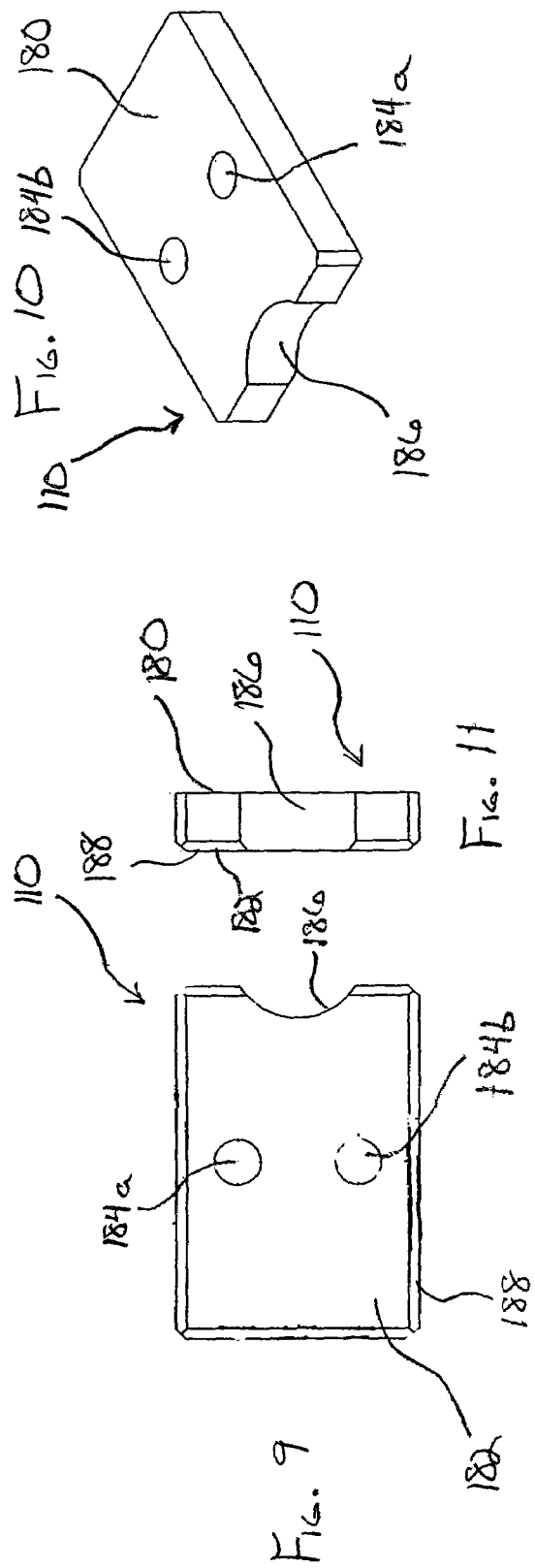

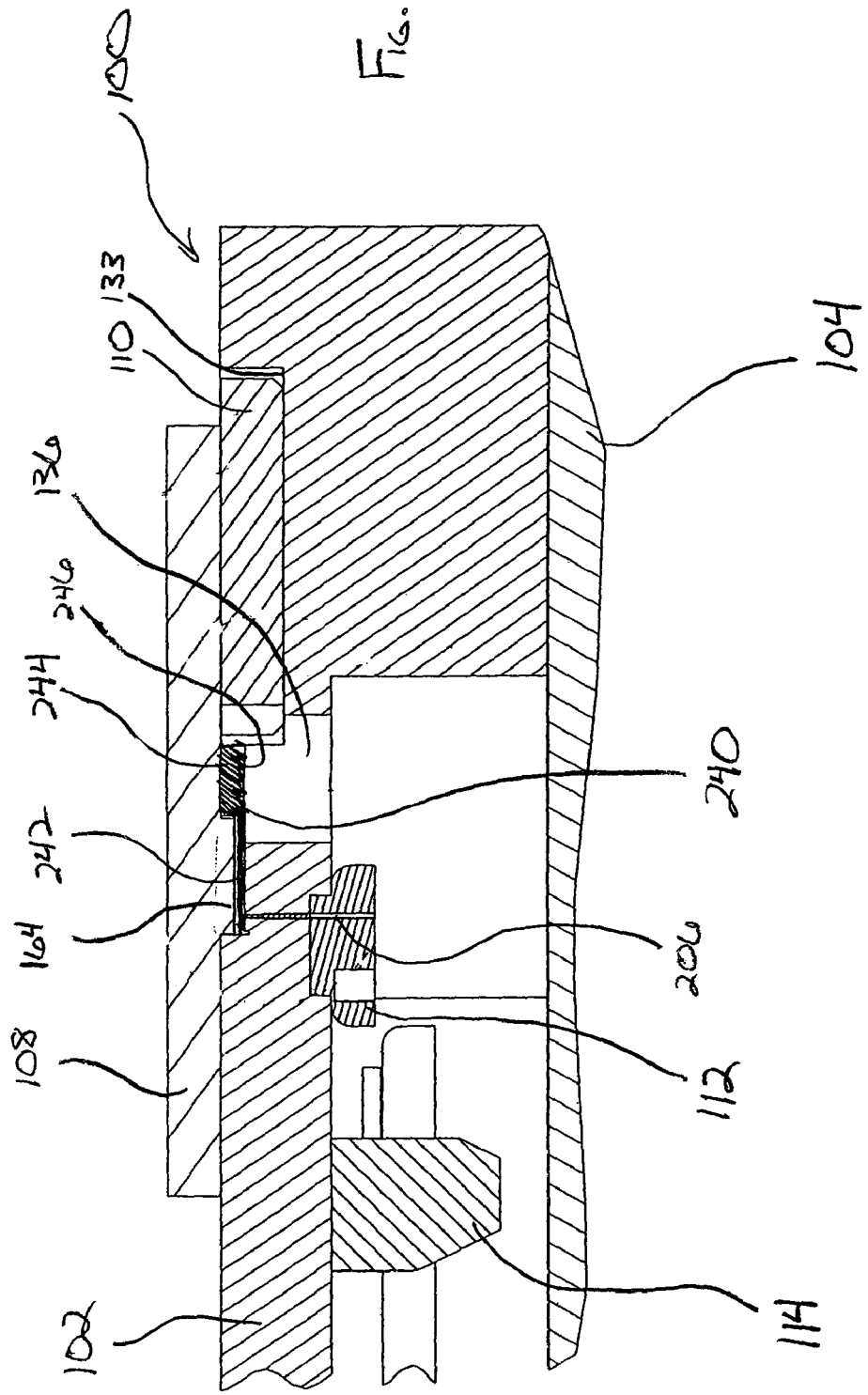

VCSEL SETTLING FIXTURE

FIELD OF THE INVENTION

The present invention relates generally to the field of burn-in testing of optoelectronic devices. More specifically, the present invention relates to a dielectric fixture allowing a plurality of Vertical Cavity Surface Emitting Lasers (VCSELs) to be selectively activated and tested within an environmental chamber.

BACKGROUND OF THE INVENTION

In order to transmit data over fiber optic networks, edge-emitting lasers and Vertical Cavity Surface Emitting Lasers (VCSEL) are commonly used to generate the data carrying signal. Edge-emitting lasers, emit photons out of one edge of the wafer after the photons rebound off mirrors cleaved in the substrate. Manufacturing edge-emitting lasers requires a wafer cutting operation to expose the sides from which the laser is emitted. VCSELs, on the other hand, include mirrors grown into the surface of the structure allowing laser light to emit a cylindrical beam in a perpendicular orientation to the wafer surface. As VCSELs require no wafer cutting operation to expose the laser light, VCSELs have reduced costs for manufacturing, packaging, alignment and testing. In addition, VCSELs can be tested in an uncut state such that defects can be identified prior to the expenditure of additional processing resources.

VCSELs are frequently used in parallel optical transceiver packages to generate photons for transmission through a fiber optic cable. The VCSEL is mounted to the electronic substrate of the parallel optical transceiver package by a flexible circuit. The VCSEL can then be disposed generally transverse to the electronic substrate as the conductive path of the flexible circuit is bent approximately ninety degrees.

As adhesives are typically used to bond the flexible circuit to the electronic substrate, there is a need to insure the VCSEL works appropriately prior to mounting. If not, the VCSELs must be pried from the substrate, typically resulting in damage and higher production costs or alternatively, the entire transceiver package must be disposed of. Therefore, there is a need to test the VCSELs with the attached flexible circuit under typical operating conditions prior to mounting.

SUMMARY OF THE INVENTION

The present invention is directed to burn-in testing of VCSELs. More specifically, the present invention is directed to a test fixture assembly for simultaneously testing a plurality of VCSEL assemblies within a burn-in oven or environmental chamber. Generally, the test fixture assembly includes components for retainably positioning the VCSEL assemblies, components for biasing the VCSEL assemblies with remote pendant controllers, and components allowing the VCSEL outputs to be viewed and/or measured. The components used in constructing the test fixture assembly are comprised of appropriate dielectric materials.

In a first embodiment, a test fixture assembly of the present invention includes a mounting frame. A plurality of VCSEL chip packages are mounted within recesses on the mounting frame and are physically positioned using a slider plate and retained by a clamp plate. Each VCSEL chip package is in electrical communication with a remote pendant controller through the use of terminals and connector pads. Pogo pins are interconnected with electrical tracings to selectively fire the VCSELs. As the controller causes the VCSELs to discharge, the VCSEL output may be viewed and/or measured through a transparent cover plate.

In an alternative embodiment, the present invention is directed to a method of simultaneously testing a plurality of VCSELs. A test fixture assembly is provided allowing a plurality of VCSELs to be retainably positioned within a burn-in oven or an environmental chamber such that a remote pendant controller can selectively activate each VCSEL. Each VCSEL output may be observed or measured through a transparent cover plate on the test fixture assembly.

BRIEF DESCRIPTION OF THE DRAWINGS

FIG. 1 is a perspective front view of a fixture assembly of the present invention.
FIG. 2 is an exploded perspective rear view of the fixture assembly of FIG. 1.
FIG. 3 is a front view of a mounting plate.
FIG. 4 is a rear view of the mounting plate of FIG. 3.
FIG. 5 is a sectional view of the mounting plate taken generally along line B—B of FIG. 3.
FIG. 6 is a partially assembled rear view of the mounting plate of FIG. 3.
FIG. 7 is a perspective, bottom view of a clamp plate.
FIG. 8 is a side view of the clamp plate of FIG. 7.
FIG. 9 is a bottom view of a slider plate.
FIG. 10 is a perspective, top view of the slider plate of FIG. 9.
FIG. 11 is a side view of the slider plate of FIG. 9.
FIG. 12 is a perspective, top view of a connector pad.
FIG. 13 is a bottom view of the connector pad of FIG. 12.
FIG. 14 is a side view of the connector pad of FIG. 12.
FIG. 15 is a side view of a ribbon guide.
FIG. 16 is a sectional view of the fixture assembly taken generally along line A—A of FIG. 1.

DETAILED DESCRIPTION OF THE DRAWINGS

As depicted in FIGS. 1 and 2, a VCSEL fixture assembly 100 of the present invention comprises a mounting frame 102, a cover plate 104, a ribbon guide 106, a plurality of clamp plates 108, a plurality of slider plates 110, a plurality of connector pads 112 and a plurality of terminal blocks 114. A pair of ribbon cables 116a, 116b electrically interconnect terminal blocks 114 and a remote pendant control box that is hardwired to the various VCSEL switches and monitors used during testing.

Fixture assembly 100 includes a front side 117 defined by mounting frame 102 and a rear side 118 defined by cover plate 104. For reference purposes, use of the term "front" in conjunction with fixture assembly components denotes an orientation facing the front side 117 the term "rear" denotes an orientation facing the rear side 118.

Generally, fixture assembly 100 is manufactured of a dielectric material that is dimensionally stable over a range of temperatures, for example ambient air temperature to 150° C. Suitable dielectric materials include polyimides such as Dupont Kapton® and polyimide composites such as Dupont Oasis®.

Mounting frame 102 is more clearly depicted in FIGS. 3, 4 and 5. Generally, mounting frame 102 comprises a front mounting side 120 (FIG. 3) and a rear mounting side 122 (FIG. 4). Mounting frame 102 has a rectangular perimeter 124 defined by a pair of horizontal mounting sides 126a, 126b and a pair of vertical mounting sides 128a, 128b.

Mounting frame 102 includes a plurality of mounting plate coupling throughbores 130 generally located at the corners of rectangular perimeter 124.

As illustrated in FIG. 3, front mounting side 120 of mounting frame 102 comprises a generally flat surface including a plurality of spaced-apart recesses 131 comprised of a mounting pocket 132 and a slider pocket 133. Each recess 131 includes a pair of diagonally opposed clamping bores 134a, 134b. Within each recess 131 is a recess throughbore 136.

As illustrated in FIGS. 4 and 5, rear mounting side 122 of mounting frame 102 includes a recessed surface 138 defined by mounting sides 126a, 126b and mounting ends 128a, 128b. Mounting end 128a includes a mounting cut-out 140 to a depth substantially equal to recessed surface 138. A pair of guide bores 142a, 142b are present on recessed surface 138 within mounting cut-out 140. Rear side 122 further includes a pair of side attachment surfaces 144a, 144b, an end attachment surface 146 and a partial, end attachment surface 148.

A partially assembled mounting frame 102 is further depicted in FIG. 6. A plurality of terminals 150 and a plurality of contact blocks 152 are mounted to recess surface 138. Generally, contact block 152 is positioned roughly approximate to each recess throughbore 136 such that contact block 152 is positioned between terminal 150 and recess throughbore 136. Mounting frame 102 includes electrically conductive traces electrically connecting terminals 150 and contact blocks 152. Terminals 150 are configured electrical interconnection with ribbon cables 116a, 116b.

FIGS. 7 and 8 depict clamp plate 108. Clamp plate 108 includes a rear clamping surface 160 and a front clamping surface 162. Projecting outward from rear clamping surface 160 is a clamp guide 164. Clamp plate 108 also includes a pair of diagonally opposed clamp throughbores 166a, 166b dimensioned to correspond to clamping bores 134a, 134b disposed through front mounting side 120. Clamp plate 108 has a generally rectangular configuration with two corners proximate bore 166a eliminated, leaving angled surfaces 168a, 168b.

FIGS. 9, 10 and 11 depict slider plate 110. Slider plate 110 includes a front slider surface 180 and a rear slider surface 182. Slider plate 110 includes a pair of slider throughbores 184a, 184b. Slider plate 110 has a generally rectangular configuration with an arcuate indentation 186 at one end. Slider plate 100 is dimensioned so as to fit within slider pocket 133. The perimeter of rear surface 182 has a beveled edge 188 leading to rear surface 182.

FIGS. 12, 13 and 14 depict connector pad 112. Connector pad 112 has a generally rectangular configuration including a front connector surface 200 and a rear connector surface 202. Front connector surface 200, defined by beveled adjacent sides of connector pad 112, includes a raised insertion surface 204. Raised insertion surface 204 is generally oval-shaped and is disposed on front connector surface 200. Located on raised insertion surface 204 are a plurality of pogo pin contacts 206. Examples of suitable pogo pin contacts 206 include the μHELIX® family of test probes manufactured by AlphaTest Corporation. Pogo pin contacts include an integral spring (not shown) allowing the contacts to retract and be positively held against a desired contact portion of an electronic device. Pogo pin contacts 206 extend through connector pad 112 such that a plurality of connector leads 208 are presented on rear connector surface 202. Connector pad 112 also includes a pair of pad throughbores 210a, 210b and a pad bore 212 on rear connector surface 202.

As depicted in FIG. 2, cover plate 104 includes a front cover surface 220 and a rear cover surface 222. Rear cover surface 222 defines rear assembly surface 118. Cover plate 104 has a rectangular cover perimeter 224 substantially resembling mounting plate 102. Cover plate 104 includes a plurality of cover plate coupling throughbores 226 that dimensionally correspond to mounting plate coupling throughbores 130. Cover plate 104 comprises a transparent, dielectric material capable of allowing laser light emitted by the VCSELS to be transmitted to an optical reader/sensor located in proximity.

As illustrated in FIGS. 2 and 15, ribbon guide 106 has front guide surface 230 and a rear guide surface 232. Ribbon guide 106 has a generally rectangular configuration dimensioned to fit within mounting cut-out 140 such that a pair of guide throughbores 234a, 234b correspond to guide bores 142a, 142b.

In operation, VCSEL fixture assembly 100 is assembled as partially depicted in FIG. 16 to allow for simultaneous testing of a plurality of VCSEL chip packages 240. Suitable VCSEL chip packages 240 are further described in U.S. Pat. No. 6,322,257 entitled "Optical Array Chip Packages With Passive Alignment Features," which is commonly assigned to the assignee of the present invention and is hereby incorporated by reference in its entirety.

In its preferred form, VCSEL chip package 240 comprises a substantially flat, flexible circuit 242 with a VCSEL 244. Flexible circuit 242 is attached to the blind side of VCSEL 244 with an adhesive layer 246. Flexible circuit 242 and adhesive layer 246 include electrical traces having electrically conductive material such that VCSEL 242 can be electrically connected to an external wiring board.

Generally, VCSEL chip package 240 is positioned within recess 131 such that the active face of VCSEL 244 is centered over recess throughbore 136 and faces rear assembly surface 118. Next, slider plate 110 is positioned within slider pocket 133 such that rear slider surface 182 is oriented toward rear assembly surface 118 and arcuate indentation 186 extends around a portion of VCSEL 244. Slider plate 110 is slidably advanced against VCSEL 244 such that arcuate indentation 186 eliminates side-to-side travel of VCSEL chip package 240.

Next, clamp plate 108 is positioned over recess 131 such that clamp guide 164 fits snugly against the flexible circuit 242 of VCSEL chip package 240. Using clamp throughbores 166a, 166b in conjunction with clamping bores 134a, 134b, clamp plate 108 is fixedly attached to mounting plate 102 with an appropriate fastener preventing any movement of VCSEL chip package 240 in either a forward or reverse direction. Attached clamp plate 108 also retains slider plate 110 and VCSEL chip package 240 within recess 131. Attached clamp plate 108 forces conductor pads on flexible circuit 242 into contact with pogo pins 206. The integral springs of pogo pins 206 promote electrical interconnection between the VCSEL chip package 240 and the pogo pins 206.

Once clamp plate 108 is fixedly attached to mounting frame 102, ribbon cables 116a, 116b are routed through mounting cut-out 140 to terminal blocks 114. Ribbon cables 116a, 116b are fixedly attached to terminal blocks 114 so that remote pendant control box (not shown) is in electrical communication with terminal blocks 114. In order to prevent cable strain from loosening the connection between ribbon cables 116a, 116b and terminal block 114, ribbon guide 106 is placed within mounting cut-out 140 such that guide bores 142a, 142b are aligned with guide throughbores 234a, 234b while ribbon cables 116a, 116b are captured between ribbon guide 106 and mounting cut-out 140. Using an appropriate fastener, ribbon guide 106 is fixedly attached within mounting cut-out 140 such that external forces applied to ribbon cables 116a, 116b cannot cause them to dislodge from terminal blocks 114.

Finally, cover plate 104 is positioned such that cover plate coupling throughbores 226 on front cover surface 220 are aligned with mounting plate coupling throughbores 130. Using appropriate fasteners, cover plate 104 is coupled to mounting frame 102 to complete the assembly of VCSEL fixture assembly 100. Optical sensors can then be positioned proximate rear cover surface 222 to allow laser amplitude and other characteristics to be measured during the burn-in process.

Although a preferred embodiment of the present invention has been disclosed and described here for purposes of illustration, it should be understood that a variety of changes, modifications and substitutions may be incorporated without departing from either the spirit or scope of the present invention.

The invention claimed is:

1. A VCSEL settling test fixture for simultaneously testing a plurality of VCSEL chip packages inside a testing chamber having a remote pendant controller, each of the VCSEL chip packages comprising a discharge array and a flexible circuit wherein the discharge array is operably connected to the flexible circuit and the flexible circuit includes a plurality of wire traces interconnected to a plurality of activation pads, the fixture comprising:
   a mounting frame, the mounting frame comprised of a dielectric substrate with a first side and an opposing second side, the first side including a plurality of segmented recesses wherein each segmented recess includes a throughbore, each segmented recess adapted to accommodate a one of the VCSEL chip packages and align the discharge array of said one VCSEL chip package with the throughbore, the second side including a plurality of terminal blocks operably connected to the remote pendant controller, each of the terminal blocks in proximity to the throughbore; and
   an activation system operably connected to each terminal block of the second side so as to selectively trigger the VCSEL chip package disposed on the first side.

2. The VCSEL settling test fixture of claim 1 wherein the segmented recesses comprise a flexible circuit recess accommodating the flexible circuit of the VCSEL chip package and a discharge array recess accommodating the discharge array of the VCSEL chip package.

3. The VCSEL settling test fixture of claim 1 wherein the terminal blocks are operably connected to the remote pendant controller with a plurality of ribbon cables.

4. The VCSEL settling test fixture of claim 3 wherein the plurality of ribbon cables are fixedly retained with a strain relief member on the mounting frame.

5. The VCSEL settling test fixture of claim 1 wherein the activation system comprises a plurality of clamp assemblies, each clamp assembly having a plurality of electrical connectors, the clamp assembly adapted to fit within the segmented recess and retainably position the VCSEL chip package such that the electrical connectors complete an electrical circuit between the activation pads on the VCSEL chip package and the terminal block on the second side.

6. The VCSEL settling test fixture of claim 5 wherein the electrical connectors comprise spring loaded pogo pins.

7. The VCSEL settling test fixture of claim 1 wherein the mounting frame further comprises a transparent cover sheet adapted to securely attach to the second side, the transparent cover sheet allowing transmission of a laser output from the VCSEL chip package through the transparent cover sheet.

8. The VCSEL settling test fixture of claim 7 wherein the laser output of the VCSEL chip package is measured by an optical sensor mounted adjacent to an output face of the VCSEL chip package.

9. The VCSEL settling test fixture of claim 8 wherein the optical sensor measures a discharge characteristic of the laser output.

10. A VCSEL settling test fixture for simultaneously testing a plurality of VCSEL chip packages inside a testing chamber having a remote pendant controller, each of the VCSEL chip packages comprising a discharge array and a flexible circuit wherein the discharge array is operably connected to the flexible circuit and the flexible circuit includes a plurality of wire traces interconnected to a plurality of activation pads, the fixture comprising:
   a mounting frame, the mounting frame comprised of a dielectric substrate with a first side and an opposing second side, the first side including a plurality of segmented recesses wherein each segmented recess includes a throughbore, each segmented recess adapted to accommodate one of the VCSEL chip packages and align the discharge array of said one VCSEL chip package with the throughbore, the second side including a plurality of terminal blocks operably connected to the remote pendant controller, each of the terminal blocks in proximity to the throughbore; and
   means for selectively triggering the discharge array on the VCSEL chip package with the remote pendant controller.

11. The VCSEL settling test fixture of claim 10 wherein the triggering means comprises an activation system comprising a plurality of clamp assemblies, each of the clamp assemblies having a plurality of electrical connectors, the clamp assembly adapted to retainably position the VCSEL chip package such that the electrical connectors complete an electrical circuit between the VCSEL chip package and the remote pendant controller.

12. The VCSEL settling test fixture of claim 11 wherein the electrical connectors comprise spring loaded pogo pins.

* * * * *

UNITED STATES PATENT AND TRADEMARK OFFICE
CERTIFICATE OF CORRECTION

PATENT NO. : 7,135,704 B2 Page 1 of 1
APPLICATION NO. : 10/641398
DATED : November 14, 2006
INVENTOR(S) : Robert J. Monson, Trevor J. McCollough and Jianhua (Jack) Yan It is certified that error appears in the above-identified patent and that said Letters Patent is hereby corrected as shown below:

Title page, item [73] Assignee should be Lockheed Martin Corporation

Signed and Sealed this

Twenty-third Day of January, 2007

JON W. DUDAS
*Director of the United States Patent and Trademark Office*